US011120862B2

(12) United States Patent
Takeda

(10) Patent No.: US 11,120,862 B2
(45) Date of Patent: Sep. 14, 2021

(54) NON-VOLATILE MEMORY READ METHOD FOR IMPROVING READ MARGIN

(71) Applicant: RENESAS ELECTRONICS CORPORATION, Tokyo (JP)

(72) Inventor: Koichi Takeda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/828,545

(22) Filed: Mar. 24, 2020

(65) Prior Publication Data

US 2020/0327921 A1    Oct. 15, 2020

(30) Foreign Application Priority Data

Apr. 10, 2019   (JP) .............................. JP2019-074691

(51) Int. Cl.
| | |
|---|---|
| *G11C 7/12* | (2006.01) |
| *G11C 11/4074* | (2006.01) |
| *G11C 11/4076* | (2006.01) |
| *G11C 11/4091* | (2006.01) |
| *G11C 11/4094* | (2006.01) |
| *G11C 11/408* | (2006.01) |

(Continued)

(52) U.S. Cl.
CPC ............ *G11C 11/4074* (2013.01); *G11C 7/12* (2013.01); *G11C 11/4076* (2013.01); *G11C 11/4085* (2013.01); *G11C 11/4091* (2013.01); *G11C 11/4094* (2013.01); *G11C 16/02* (2013.01); *G11C 16/0408* (2013.01); *G11C 16/24* (2013.01); *G11C 16/26* (2013.01); *G11C 16/28* (2013.01)

(58) Field of Classification Search
CPC ....... G11C 7/12; G11C 16/24; G11C 16/0483; G11C 16/26; G11C 16/28; G11C 16/0406; G11C 11/4091
See application file for complete search history.

(56) References Cited

U.S. PATENT DOCUMENTS

| | | | |
|---|---|---|---|
| 2004/0047207 A1* | 3/2004 | Mori ................... | G11C 11/5642 365/202 |
| 2005/0117381 A1* | 6/2005 | Takano ............... | G11C 11/5642 365/145 |

(Continued)

OTHER PUBLICATIONS

Tachui NA et al., "Data-Cell-Variation-Tolerant Dual-Mode Sensing Scheme for Deep Submicrometer STT-RAM", IEEE Transactions on Circuits and Systems-I: Regular Papers, vol. 65, No. 1, Jan. 2018, pp. 163-174.

*Primary Examiner* — Mushfique Siddique
(74) *Attorney, Agent, or Firm* — McDermott Will & Emery LLP

(57) ABSTRACT

A semiconductor device capable of enlarging a read margin of a memory cell and a method of surrounding a read of a memory are provided. The reference word line RWL is activated in a time division manner with respect to the plurality of word lines WL. The precharge circuit PRE applies the read potential VRD to the bit line BL, and the precharge circuit PRE flows the read current Icel from the selected memory cell MC and the read reference current Iref from the reference cell RC to the bit line BL in a time division manner. A detection currents Ird2a, Irr2a, each of which is a current proportional to the current flowing through the bitline BL, flows through the current detection line CDL.

16 Claims, 15 Drawing Sheets

(51) Int. Cl.
*G11C 16/02* (2006.01)
*G11C 16/26* (2006.01)
*G11C 16/28* (2006.01)
*G11C 16/24* (2006.01)
*G11C 16/04* (2006.01)

(56) References Cited

U.S. PATENT DOCUMENTS

| | | | |
|---|---|---|---|
| 2006/0098490 A1* | 5/2006 | Mori | G11C 16/28 |
| | | | 365/185.22 |
| 2007/0019469 A1* | 1/2007 | Motoki | G11C 7/062 |
| | | | 365/185.03 |
| 2009/0237992 A1* | 9/2009 | Maejima | G11C 11/5642 |
| | | | 365/185.03 |
| 2010/0118595 A1* | 5/2010 | Bae | G11C 13/0038 |
| | | | 365/148 |
| 2016/0180928 A1* | 6/2016 | Kim | G11C 13/0033 |
| | | | 711/125 |

* cited by examiner (a)

NON-VOLATILE MEMORY READ METHOD
FOR IMPROVING READ MARGIN

CROSS-REFERENCE TO RELATED APPLICATIONS

The disclosure of Japanese Patent Application No. 2019-074691 filed on Apr. 10, 2019 including the specification, drawings and abstract is incorporated herein by reference in its entirety.

BACKGROUND

The present invention relates to a semiconductor device and a memory reading method, and, for example, to a semiconductor device including a flash memory and a flash memory reading method.

[Non-Patent Document 1] "Data-Cell-Variation-Tolerant Dual-Mode Sensing Scheme for Deep Submicrometer STT-RAM," IEEE TRANSACTIONS ON CIRCUITS AND SYSTEMS I: REGULAR PAPERS, Vol. 65, No. 1, January 2018, p. 163-174

Non-Patent Document 1 shows a configuration of a sense amplifier circuit in a spin injection memory. In the sense amplifier circuit, a precharge circuit for applying a read potential to a bit line to which a selected memory cell is connected, and a circuit for storing a read current from the selected memory cell and comparing it with a read reference current from the reference cell are provided on the same current path. In a read operation, the read current from the selected memory cell to the bit line is stored in the first half using time division, and the stored read current is compared with the read reference current read from the reference cell to the same bit line in the second half.

SUMMARY

For example, in a nonvolatile memory such as a flash memory, if the number of memory cells per bit line is increased, miniaturization, multi-level memory, or the like to increase the density, the influence of the leakage current due to the unselected memory cells becomes apparent. Specifically, as the density is increased, the ratio of the bit line leakage current of the unselected memory cell to the read current of the selected memory cell is increased. As a result, there is a possibility that the read margin, which is a margin when the storage data of the selected memory cell is discriminated, is lowered.

The embodiments described below have been made in view of the above, and other problems and novel features will be apparent from the description of the present specification and the accompanying drawings.

A semiconductor device according to an embodiment includes a plurality of word lines, a plurality of bit lines, a plurality of memory cells, a reference word line, a reference cell, a precharge circuit, a current detection line, and a current comparison circuit. The plurality of memory cells are respectively provided at intersections of the plurality of word lines and the bit lines, and are respectively selected by the plurality of word lines. The reference word lines are activated in a time division manner with respect to a plurality of word lines. The reference cell is provided at the point of intersection of the reference word line and the bit line, and is selected by the reference word line. The precharge circuit applies a read potential to the bit line, and causes a read current from a selected memory cell selected by one of the plurality of word lines and a read reference current from the reference cell to flow through the bit line in a time-division manner. A detection current, which is a current proportional to the current flowing through the bit line, flows through the current detection line. The current comparison circuit is connected to the current detection line, and compares the magnitude of the read current flowing through the current detection line in a time-division manner with the magnitude of the read reference current.

According to the above-mentioned embodiment, it is possible to enlarge the read margin of the memory cell.

DETAILED DESCRIPTION

Figure 1:
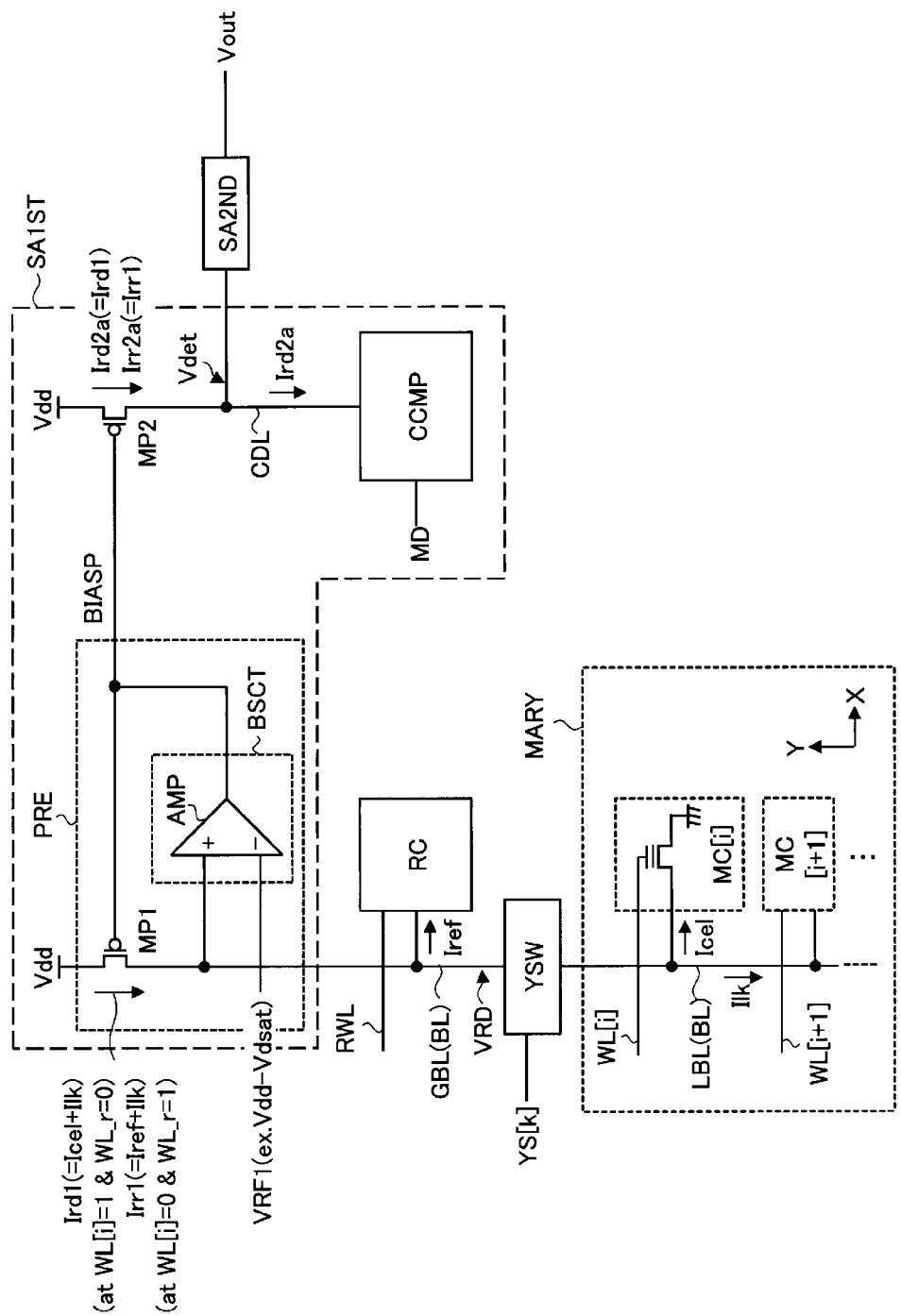
FIG. 1 is a circuit block diagram showing a configuration example of a main part in a semiconductor device according to a first embodiment of the present invention.

In the following embodiments, when it is necessary for convenience, the description will be made by dividing into a plurality of sections or embodiments, but except for the case where it is specifically specified, they are not independent of each other, and one of them is related to some or all of modifications, details, supplementary description, and the like of the other. In the following embodiments, the number of elements or the like (including the number, number, quantity, range, and the like) is not limited to the specific number except the case where it is specified in particular or the case where it is obviously limited to the specific number in principle, and may be a specific number or more or less.

Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

The circuit elements constituting the functional blocks of the embodiment are not particularly limited, but are formed on a semiconductor substrate such as a single-crystal silicon substrate by an integrated circuit technique such as a well-known complementary MOS transistor (CMOS). Note that although MOSFET (Metal Oxide Semiconductor Field Effect Transistor (abbreviated as MOS transistor) is used as an example of the MISFET (Metal Insulator Semiconductor Field Effect Transistor) in the embodiment, a non-oxide film is not excluded as the gate insulating film. In the drawing, the p-channel MOS transistor (pMOS transistor) is distinguished from the N-channel MOS transistor (nMOS transistor) by attaching a circle symbol to its gates. Although the connection of the substrate potential of the MOS transistor is not specifically described in the drawings, the connection method is not particularly limited as long as the MOS transistor can operate normally.

Hereinafter, embodiments of the present invention will be described in detail with reference to the drawings. In all the drawings for explaining the embodiments, the same members are denoted by the same reference numerals in principle, and repetitive descriptions thereof are omitted.

Embodiment 1

(Configuration of Semiconductor Device)

FIG. 1 is a circuit block diagram showing a configuration example of a main part in the semiconductor device according to the first embodiment of the present invention. The semiconductor device of Embodiment 1 is, for example, a memory device, a microcontroller device including a memory circuit, a logic circuit, and an analogue circuit, or a SoC (System on a Chip) device. FIG. 1 shows a configuration example of a main part of a memory circuit portion in such a semiconductor device. The semiconductor device shown in FIG. 1 includes a memory array MARY, a bit-line selection circuit YSW, a reference cell RC, a sense amplifier circuit [1] SA1ST, and a sense amplifier circuit [2] SA2ND.

The memory array MARY includes a plurality of word lines WL[i], WL[i+1], ... extending in the X-axis direction, a local bit line LBL extending in the Y-axis direction intersecting the X-axis direction, and a plurality of memory cells MC[i], MC[i+1], .... In the description of the first embodiment, the definitions of the X-axis direction and the Y-axis direction are for convenience, and the direction in which the word line WL extends may be the Y-axis direction, and the direction in which the local bit line extends may be the X-axis direction. In the specification, a plurality of word lines are collectively referred to as word lines WL, and a plurality of memory cells are collectively referred to as memory cells MC. The plurality of memory cells MC[i], MC[i+1], ... are respectively provided at intersections of the plurality of word lines WL[i], WL[i+1], ... and the local bit line LBL, and are respectively selected by the plurality of word lines WL[i], WL[i+1], .... In this specification, the memory cell MC selected by any one of the plurality of word lines WL is referred to as a selected memory cell MC.

The memory cell MC is, for example, a flash memory cell. Although omitted in FIG. 1 for the sake of simplicity, the memory array MARY includes a plurality of local bit lines LBL in detail. In this case, the memory cells MC are provided at intersections of the plurality of word lines WL and the plurality of local bit lines LBL, respectively, and arranged in a matrix. Each memory cell MC is selected by one of a plurality of word lines WL and one of a plurality of local bit lines LBL.

The global bit lines GBL are provided commonly to a plurality of local bit lines LBL, e.g., 32 local bit lines LBL. For the sake of simplicity, only one local bit line LBL is shown in FIG. 1. The bit line selection circuit YSW connects any of the plurality of local bit lines LBL to the global bit line GBL in response to the bit line selection signal YS[k]. In detail, the semiconductor device also includes a plurality of global bit lines GBL. In this case, similarly, a bit line selection circuit YSW and a plurality of local bit lines LBL are provided for each global bit line GBL.

In the specification, when there is no particular need to distinguish, the local bit line LBL and the global bit line GBL are collectively referred to as a bit line BL. For example, in a state where one local bit line LBL is connected to the global bit line GBL via the bit line selection circuit YSW, the local bit line LBL and the global bit line GBL can be regarded as one bit line BL.

The reference cell RC is provided at the point of intersection of the reference word line RWL and the global bit line GBL, and is selected by the reference word line RWL. The reference cell RC includes, for example, a constant current source or the like, and generates a read reference current Iref for determining the magnitude of the read current Icel from the selected memory cell MC at the time of a read operation. The reference word line RWL is activated in a time division manner with respect to a plurality of word lines WL, as will be described later in detail.

The sense amplifier circuit [1] SA1ST includes a precharge circuit PRE, a pMOS transistor MP2, and a current comparator circuit CCMP. In general, during a read operation, the precharge circuit PRE applies a read potential VRD to the bit line BL (detail, the local bit LBL selected via the global bit line GBL) to cause a read current Icel from the selected memory cell MC and a read reference current Iref from the reference cell RC to flow to the bit line BL in a time-division manner. The precharge circuit PRE includes a pMOS transistor MP1 and a bias control circuit BSCT.

The pMOS transistor MP1 is provided with a current path between the power supply potential Vdd and the global bit line GBL, and functions as a current source for causing a read current Icel or a read reference current Iref to flow through the bit line BL. The bias control circuit BSCT includes, for example, an amplifier circuit AMP, and feedback-controls the bias potential BIASP, which is the gate potential (control potential) of the pMOS transistor MP1, with the potential of the bit line BL (global bit line GBL) and a predetermined reference potential VRF1 as inputs.

In the pMOS transistor MP2, a current path is provided between the power supply potential Vdd and the current detecting line CDL, and the same bias potential BIASP as the bias potential of the pMOS transistor MP1 is applied to the current detecting line CDL. As a result, the pMOS transistor MP2 functions as a current source for the current mirror for the pMOS transistor MP1, and causes a detection current, which is a current proportional to the current flowing through the bit line BL, to flow through the current detection line CDL. In this embodiment, the ratio of the gate width to the gate length (gate width (W)/gate length (L)) of the pMOS transistor MP1,MP2 is assumed to be the same. In this case, the magnitude of the detection current flowing through the current detection line CDL is equal to the magnitude of the current flowing through the bit line BL.

The current comparator CCMP is connected to the current detection line CDL, and generally compares the magnitudes of the read current Icel (detail, the detection current Ird2a) and the read reference current Iref (specifically, the detection current Irr2a) flowing through the current detection line CDL in a time-division manner. At this time, the current comparison circuit CCMP operates in the storage mode and the comparison mode in response to the mode switching signal MD, for example, stores the read current Icel in the storage mode, and compares the magnitude of the storage current and the read reference current Iref in the subsequent comparison mode. The sense amplifier circuit [2] SA2ND amplifies the detected potential Vdet on which the comparison result of the current comparison circuit CCMP is reflected, thereby outputting the output signal Vout of "1" level (power supply potential Vdd level) or "0" level (grounding power supply potential level).

(Details of Each Part)

Figure 2:
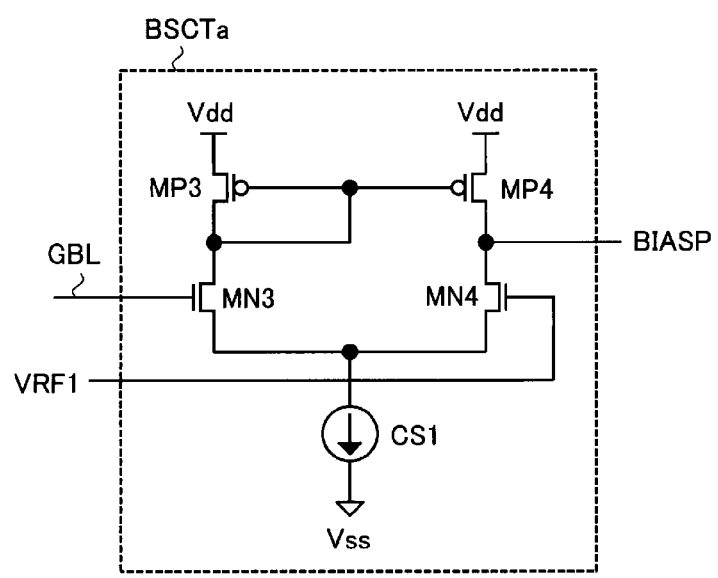
FIG. 2 is a circuit diagram showing a configuration example of a bias control circuit in FIG. 1.

FIG. 2 is a circuit diagram showing a configuration example of the bias control circuit in FIG. 1. The bias control circuit BSCTa shown in FIG. 2 has a differential amplifier circuit which is an amplifier circuit AMP shown in FIG. 1. The differential amplifier circuit includes a nMOS transistor MN3,MN4 serving as a differential pair transistor, a pMOS transistor MP3,MP4 serving as a load current source, and a constant current source CS1 serving as a tail current source. The differential amplifier feedback-controls the bias potential BIASP of FIG. 1 so that the potential of the bit line BL input to the nMOS transistor MN3 matches the reference potential VRF1 input to the nMOS transistor MN4.

Specifically, when the potential of the global bit line GBL serving as the positive input is higher than the reference potential VRF1 serving as the negative input, the bias potential BIASP is increased. As a result, the pMOS transistor MP1 changes in the off-direction, and negative feedback control is performed in the direction in which the potential of the global bit line GBL decreases. Conversely, when the potential of the global bit line GBL is lower than the reference potential VRF1, the bias potential BIASP becomes low. As a result, the pMOS transistor MP1 changes in the on-direction, and the negative feedback control acts in the direction in which the potential of the global bit line GBL increases.

Figure 3A:
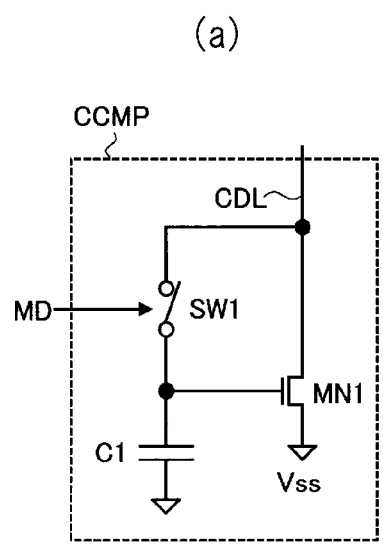
FIG. 3A is a circuit diagram showing a configuration example of the current comparison circuit in FIG. 1.
Figure 3B:
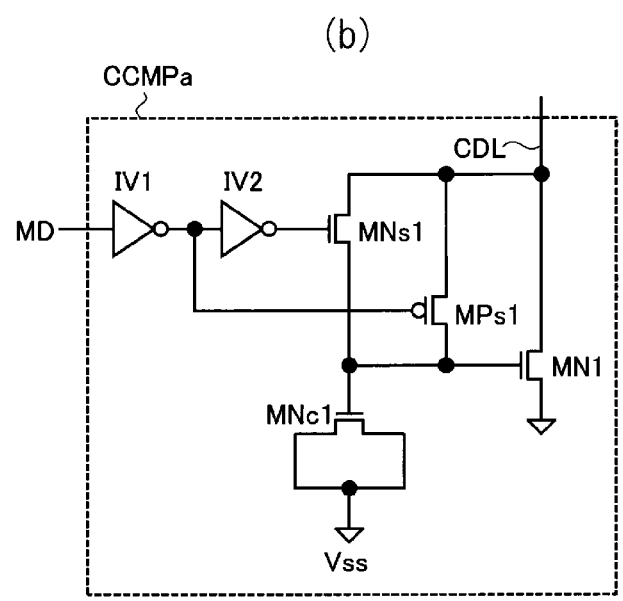
FIG. 3B is a circuit diagram showing a more detailed configuration example of FIG. 3A.

FIG. 3(a) is a circuit diagram showing a configuration example of the current comparison circuit in FIG. 1, and FIG. 3(b) is a circuit diagram showing a more detailed configuration example of FIG. 3(a). The current comparator CCMP shown in FIG. 3A includes a nMOS transistor MN1, a changeover switch SW1, and a capacitor C1. The nMOS transistor MN1 has a current path between the current detecting line CDL and the grounding power supply potential Vss, and functions as a current source. The changeover switch SW1 is controlled to be on/off in response to the mode-switching signal MD, and when the mode-switching signal MD is controlled to be on, the changeover switch switches the nMOS transistor MN1 to diode-connected (gate-drain short-circuit). The capacitor C1 is provided between the gate (control node) of the nMOS transistor MN1 and the grounding power supply potential Vss, and holds the gate potential (control node) of the nMOS transistor MN1.

When the changeover switch SW1 is controlled to be on, the current comparator CCMP operates in a storage mode in which the detection current flowing through the current detection line CDL is stored as the storage current. Specifically, the capacitive device C1 is charged by the detection current flowing through the current detection line CDL, so that the nMOS transistor MN1 is controlled so as to continue to flow the detection current, i.e., the storage current, even if the changeover switch SW1 is turned off.

Thereafter, when the changeover switch SW1 is controlled to be turned off, the current comparison circuit CCMP operates in a comparison mode in which the magnitude of the detection current flowing through the current detection line CDL is compared with the magnitude of the storage current stored in the storage mode. Specifically, when the magnitude of the detection current flowing through the current detection line CDL changes while the nMOS transistor MN1 continues to flow the storage current in the storage mode, the potential of the current detection line CDL changes in accordance with the amount of the change.

For example, when the storage current is less than the detection current, the input capacitance of the sense amplifier circuit [2] SA2ND in FIG. 1 is charged by the increase of the detection current, and thus the potential of the current detection line CDL (detection potential Vdet) becomes high. On the other hand, when the storage current> the detection current, the input capacitance of the sense amplifier circuit [2] SA2ND is discharged by the decreasing amount of the detection current, so that the potential of the current detection line CDL (detection potential Vdet) becomes low. The sense amplifier circuit [2] SA2ND amplifies the change in the detected potential Vdet.

In the current comparator circuit CCMPa of FIG. 3 (b), the capacitor C1 of FIG. 3 (a), since it is used to store the potential in the vicinity of the threshold voltage (Vthn) of the nMOS transistor MN1, for example, a high area-efficiency It is composed of a MOS capacitor element by the nMOS transistor MNc1. When a potential equal to or higher than the threshold voltage Vthn is applied to the nMOS transistor MN1, conductive channels are formed between the source and the drain. A capacitor is formed between a source, a drain, a channel, and a gate via a gate insulating film. Therefore, the capacitance of the MOS capacitive element becomes large.

The changeover switch SW1 shown in FIG. 3A is formed of a CMOS switch including a nMOS transistor MNs1 and a pMOS transistor MPs1 in order to pass a potential near the threshold voltage (Vthn) of the nMOS transistor MN1. The inverter circuit IV1,IV2 applies the mode-switching signal MD to the nMOS transistor MNs1, and applies the inverted signal /MD to the pMOS transistor MPs1.

Figure 4:
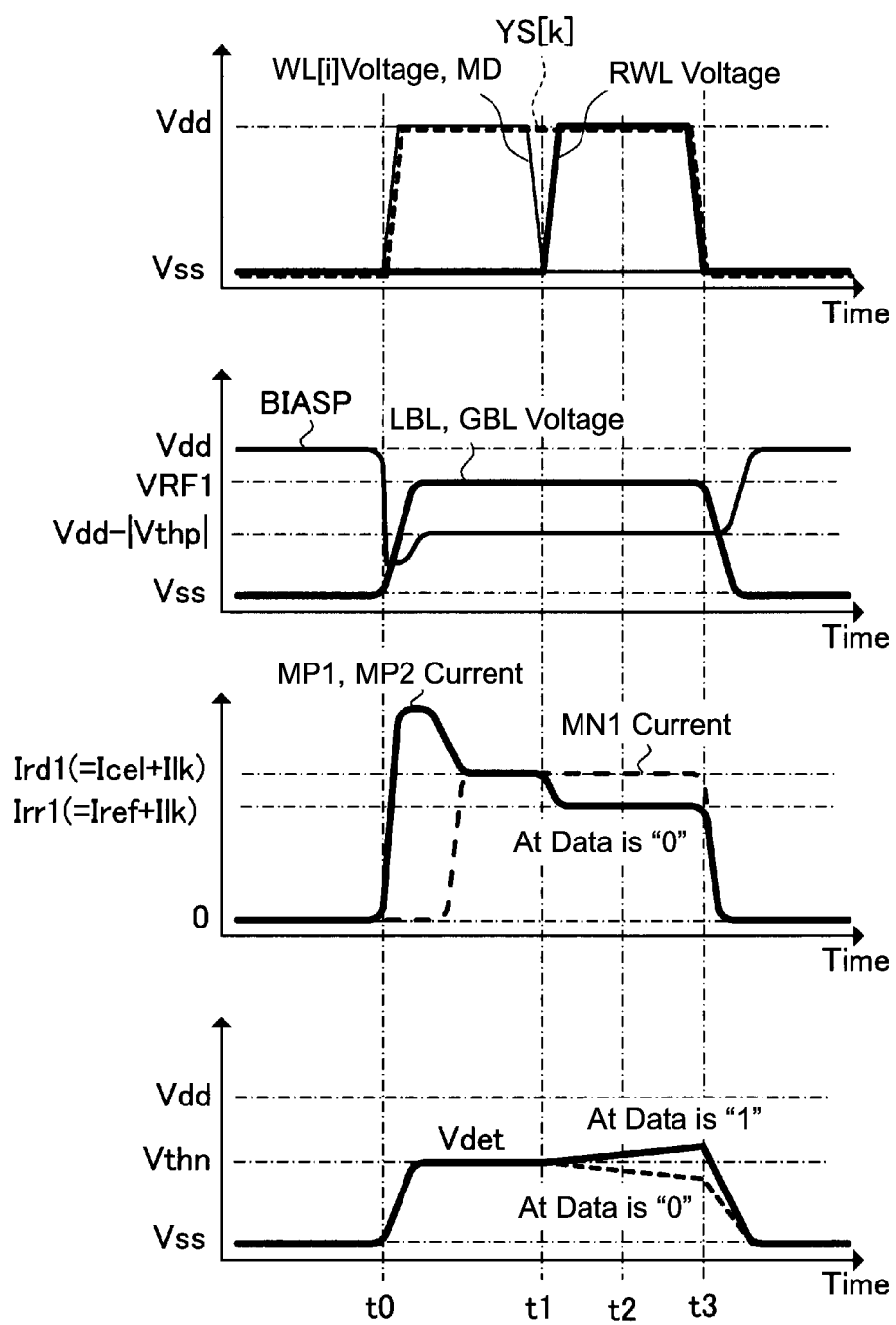
FIG. 4 is a waveform diagram showing an operation example at the time of a read operation in the semiconductor device of FIG. 1.

FIG. 4 is a waveform diagram showing an operation example at the time of a read operation in the semiconductor device of FIG. 1. At time t0 in FIG. 4, the word line WL[i] and the bit line selection signal YS[k] are activated, and the memory cell MC[i] is selected accordingly. As a result, the potentials of the bit lines BL (local bit LBL and global bit line GBL) rise from the initial-state potential lower than the reference potential VRF1 toward the reference potential VRF1. In this rising period, since the bias control circuit (the BSCTa of FIG. 2) outputs the bias potential BIASP lower than the steady state potential "Vdd−|Vthp|" (Vthp) is the threshold voltage of the pMOS transistor MP1, the current of the pMOS transistor MP1,MP2 becomes larger than the steady state current.

Thereafter, when the potential of the bit line BL reaches near the reference potential VRF1, the bias control circuit BSCTa outputs a potential in the vicinity of the steady-state "Vdd−|Vthp|" as the bias potential BIASP. As a result, the pMOS transistor MP1 reaches a steady-state while flowing the actual read current Ird1(=Icel+Ilk, which is a current obtained by adding the leakage current Ilk to the read current Icel. That is, as shown in FIG. 1, in addition to the read current Icel by the selected memory cell MC[i], a leakage current Ilk by the unselected memory cells (MC[i+1], . . . ) also flows through the local bit line LBL.

At time t0, the storage mode is selected by the activation of the word line WL[i] and the "H" level of the mode switching signal MD. As a result, the current comparator CCMP stores the detection current Ird2a(=Ird1) as the storage current while the detection current Ird2a equal to the actual read current Ird1 flows through the pMOS transistor MP2 and the nMOS transistor MN1. At this time, the detected potential Vdet is stabilized in the vicinity of the threshold voltage Vthn of the nMOS transistor MN1.

Next, at time t1, all the memory cells MC are controlled to be unselected by the inactivation of the word line WL[i], and instead, the reference cell RC is selected by the activation of the reference word line RWL. At this time, the active state of the bit line selection signal YS[k] is maintained as it is. As a result, the pMOS transistor MP1 reaches a steady-state while flowing the actual read reference current Irr1(=Iref+Ilk, which is a current obtained by adding the leakage current Ilk to the read reference current Iref. During the period until the steady-state is reached, the bias control circuit BSCTa slightly changes the bias potential BIASP in accordance with the amount of change in the current.

At time t1, the comparison mode is selected by the activation of the reference word line RWL and the "L" level of the mode switching signal MD. In the comparative mode, the nMOS transistor MN1 continues to flow the storage current (detected current Ird2a(=Ird1=Icel+Ilk) in the storage mode prior to time t1. On the other hand, a detected current Irr2a equal to the actual read-reference current Irr1 flows through the pMOS transistor MP2.

As a result, the input capacitance of the sense amplifier circuit [2] SA2ND is charged or discharged by the difference current between the sense current Irr2a(=Irr1=Iref+Ilk and the sense current (storage current) Ird2a(=Ird1=Icel+Ilk. This difference current cancels the leakage current Ilk. Therefore, it is possible to suppress a decrease in the read margin caused by the bit line leakage current and to expand the read margin.

For example, when the data stored in the selected memory cell MC[i] at the time t0 is "0" at the time t1, the input capacitance of the sense amplifier circuit [2] SA2ND is discharged and the detection potential Vdet is lower than the potential in the vicinity of the Vthn, because the data stored in the selected memory cell MC[i] at the time t0 is Icel>Iref (Ird2a>Irr2a). Conversely, when the data stored in the selected memory cell MC[i] at time t0 is "1", the data is Icel<Iref(Ird2a<Irr2a), so that the input capacitance of the sense amplifier circuit [2] SA2ND is charged and the detection potential Vdet rises from the potential near Vthn.

When the change in the detected potential Vdet reaches a certain value or more, the sense amplifier circuit [2] SA2ND is activated at time t2. The sense amplifier circuit [2] SA2ND amplifies the change in the detected potential Vdet to the CMOS level (Vdd/Vss level). When the sense amplifier circuit [2] SA2ND completes amplifying, the reference word RWL and the bit line select signal YS[k] are inactivated at time t3. As a result, the current path of the pMOS transistor MP1 (and thus the current path of the pMOS transistor MP2) is cut off, and the sense amplifier circuit [1] SA1ST is deactivated.

Here, although the read current Icel from the selected memory cell MC[i] is stored in the storage mode and the comparative with the read reference current Iref from the reference cell RC is performed in the comparison mode, a method in which the read reference current Iref is stored in the storage mode and the comparison with the read current Icel is performed in the comparison mode may be used. The reference cell RC may be provided for each of the local bit lines LBL instead of the global bit GBL. However, by providing the reference cell RC for the global bit GBL, the number of the reference cells RC can be reduced to 1/k (k is the number of the local bit lines LBL connected to the bit line selection circuit YSW) as compared with the case where the reference cells RC are provided for each local bit line LBL.

(Comparison with the Configuration and the First Embodiment of the Semiconductor Device (Comparative Example))

Figure 13:
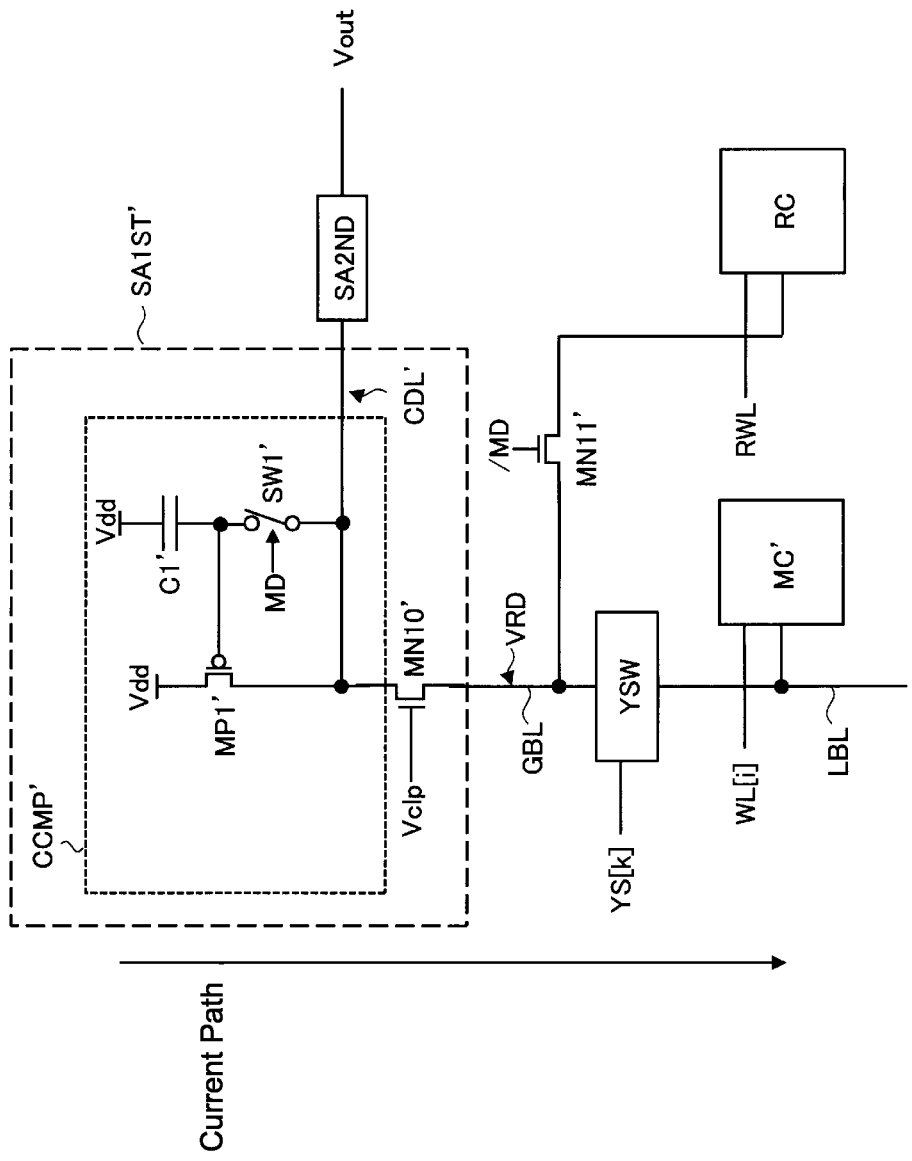
FIG. 13 is a circuit block diagram showing a configuration example of a main portion in the semiconductor device according to a comparative example of the present invention.

FIG. 13 is a circuit block diagram showing a configuration example of a main part in a semiconductor device according to a comparative example of the present invention. The semiconductor device shown in FIG. 13 has a sense amplifier circuit [1] SA1ST' which differs from the semiconductor device shown in FIG. 1. The sense amplifier circuit [1] SA1ST' includes a current comparator circuit CCMP' and a clamping nMOS transistor MN10'. The current comparator CCMP' shown in FIG. 13 includes a pMOS transistor MP1', a changeover switch SW1', and a capacitor C1'. In the current comparator CCMP', unlike the configuration of FIG. 3, a current path is provided between the power supply potential Vdd and the current detecting line CDL' by using the pMOS transistor MP1'. The current comparator CCMP' has a precharge function by being provided on the same current path as that of the selected memory cell MC'.

The readout potential VRDs are determined by the clamping potential Vclp to the nMOS transistor MN10'. The memory cell MC' is, for example, a resistor-type nonvolatile memory cell or the like. In this case, the read potential VRD is set to, for example, 100 mV. The reference cell RC is connected to the global bit line GBL via a nMOS transistor MN11' for a switch which is controlled by an inverted signal /MD of the mode switching signal MD. However, in such a semiconductor device, if the flash memory cell is applied to the memory cell MC', the following problem may occur.

As a first problem, it is not always possible to suppress a decrease in the read margin due to the bit line leakage current. For example, in FIG. 13, it is also conceivable to shift to the comparison mode by controlling the mode switching signal MD to the "L" level while activating the reference word line RWL in a state in which the bit line selection signal YS[k] is inactivated. In this case, the bit line leakage current is not canceled. On the other hand, in the semiconductor device of the first embodiment, as described with reference to FIG. 4, by shifting to the comparison mode while maintaining the active state of the bit line selection signal YS[k] in the storage mode, the influence of the leakage current Ilk can be canceled out. As a result, the read margin can be enlarged.

Figure 14:
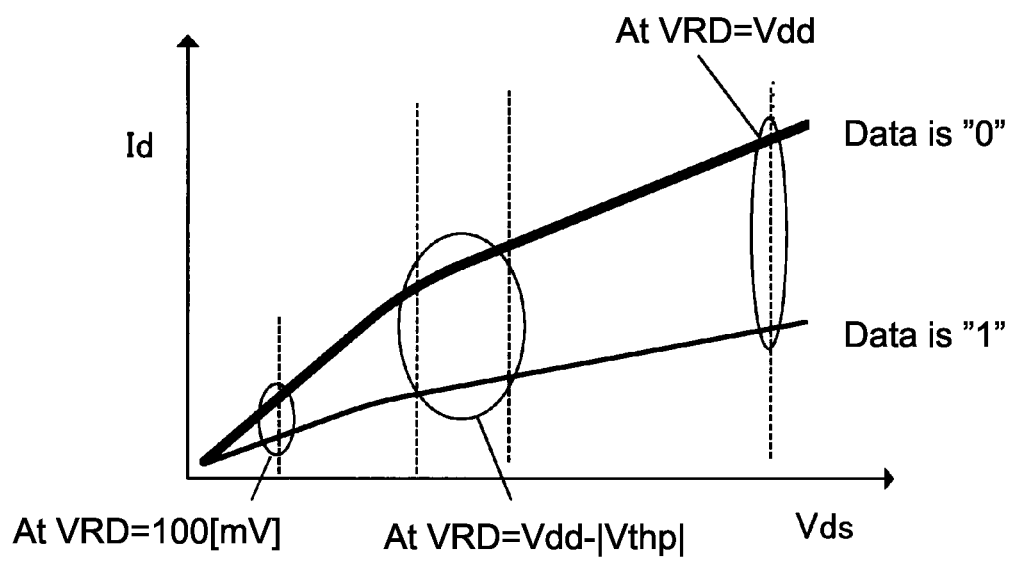
FIG. 14 is a diagram illustrating an example of the read characteristics of the flash memory cell.

As a second problem, the read potential VRD may be too low to be suitable for reading a flash memory cell. FIG. 14 is a diagram showing an example of read characteristics of a flash memory cell. In FIG. 14, for example, when the read potential VRD (the drain-source voltage Vds of the flash memory cell) is set to 100 mV, the difference between the drain current (the read current Icel in FIG. 1) is small between a state in which data "0" is stored (a state in which the threshold voltage is low) and a state in which data "1" is stored (a state in which the threshold voltage is high). As a result, the read margin is reduced.

On the other hand, as a method of raising the read potential VRD in FIG. 13, (A) a method of deleting the nMOS transistor MN10' for clamping, and (B) a method of raising the power supply potential Vdd is considered separately. When the method of (A) is used, the maximum value of the read potential VRD is about "Vdd−|Vthp|" with the threshold voltage of the diode-connected pMOS transistor MP1' as "Vthp". More strictly speaking, the maximum value of the read potential VRD is "Vdd−(|Vthp|+Vdsat)" when the saturated drain voltage of the pMOS transistor MP1' is "Vdsat". For example, "|Vthp|" is 0.4 to 0.0 6V or the like, and "Vdsat" is 0.1 to 0.0 2V or the like.

Here, as shown in FIG. 14, in the flash memory cell, the higher the read potential VRD, the larger the read margin can be. On the other hand, in the flash memory cell, the read margin also fluctuates in accordance with fluctuations in various operating conditions such as a temperature change. For example, when the power supply potential Vdd is the lowest and the threshold voltage (Vthp) of the pMOS transistor is the highest (so-called process SS and low temperature), the read margins are minimized. Conversely, when the power supply potential Vdd is the highest and the threshold voltage (Vthp) of the pMOS transistor is the lowest (so-called process FF and high temperature), the read margins are maximized. When such variation in the read margins is considered, the read potential VRD is not sufficient to be "Vdd−|Vthp|", and it is desired that the read potential VRD is as high as possible.

Therefore, it is conceivable to increase the power supply potential Vdd itself by using the method of (B). However, as a third issue, there is a possibility that a breakdown voltage violation occurs in a transistor constituting the current comparator CCMP' in addition to an increase in power dissipation. For example, in the sense amplifier circuit [1] SA1ST', a breakdown voltage violation may occur between the source and the drain of the pMOS transistor MP1' or the clamping nMOS transistor MN10'. As a countermeasure against the breakdown voltage violations, the pMOS transistor MP1' or the nMOS transistor MN10' may be configured by a high breakdown voltage transistor. However, in this case, an increase in the cost may occur due to an increase in the circuit area or a complication of the manufacturing process.

Therefore, in the semiconductor device of the first embodiment, as shown in FIG. 1, two current paths including the bit line BL and the current detection line CDL are provided, and the current comparator CCMP is connected to the current detection line CDL. As a result, a higher read potential VRD can be applied to the bit line BL without causing a breakdown voltage violation of the current comparator CCMP. As a result, the read margin can be enlarged.

Further, as a method of applying a high read potential VRD to the bit line BL, a bias control circuit BSCT is provided in the pre-charge circuit PRE. The bias control circuit BSCT sets the read potential VRD to, for example, a potential lower than the power supply potential Vdd by the saturated drain voltage Vdsat of the pMOS transistor MP1. In this instance, the reference potential VRF1 is set to "Vdd−Vdsat". As a result, as compared with the configuration example of FIG. 13, the read potential VRD can be increased by "Vthp" (for example, 0.4 to 0.0 6V) and the read margins can be enlarged without increasing the power supply potential Vdd (i.e., while suppressing an increase in power consumed).

(Method of Reading Memory)

Figure 5:
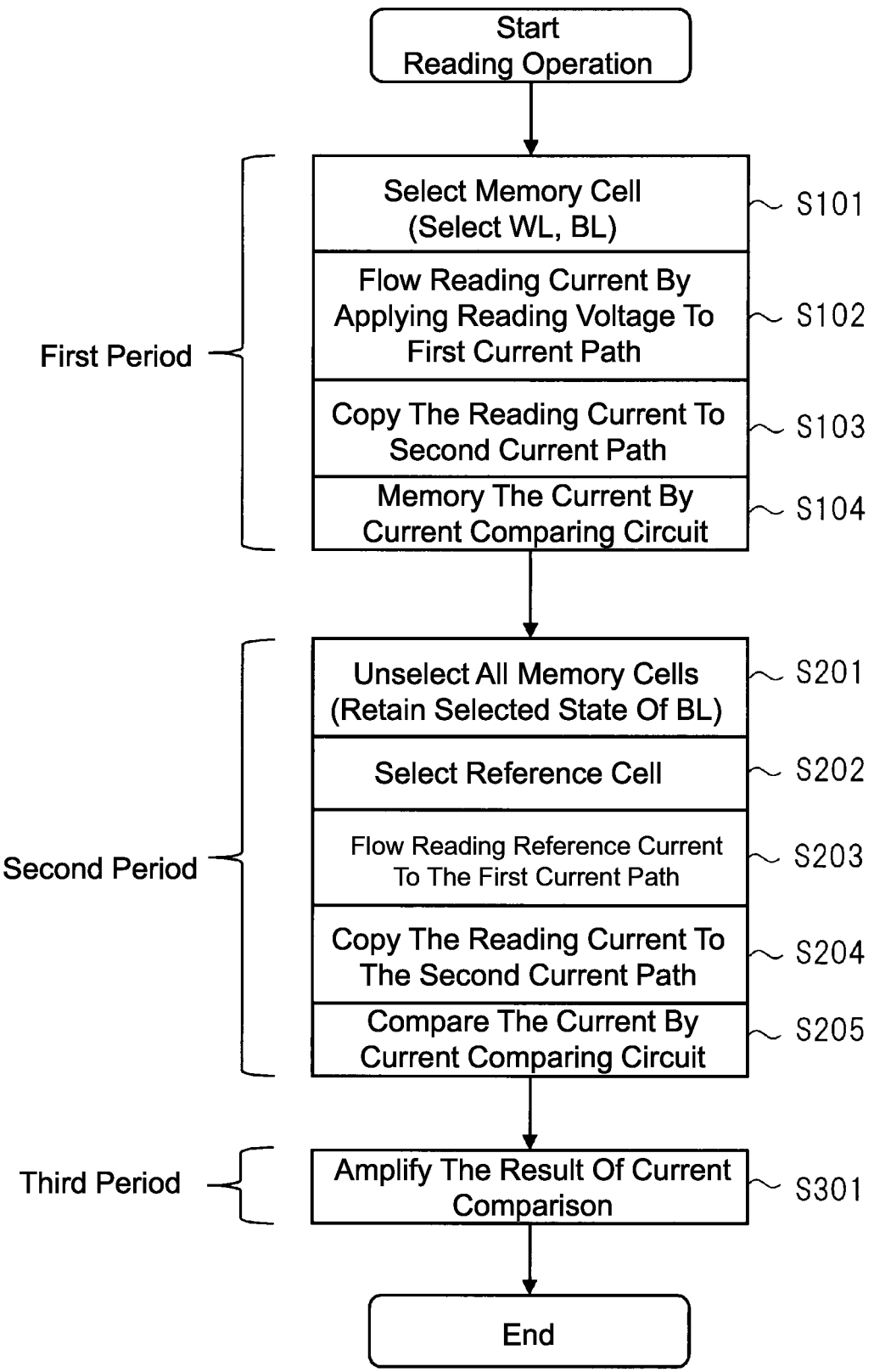
FIG. 5 is a flowchart showing an example of a memory reading method according to Embodiment 1 of the present invention.

FIG. 5 is a flowchart showing an example of a memory reading method according to the first embodiment of the present invention. First, as shown in FIG. 1, a configuration of the memory circuit is assumed to have a first current path (bit line BL) to which the plurality of memory cells MC, the reference cell RC, and the precharge circuit PRE are connected, and a second current path (current detecting line CDL) to which the current comparator circuit CCMP is connected and to which a current proportional to the current flowing in the first current path flows.

In FIG. 5, a first period (step S101~S104), a second period (step S201~S205), and a third period (step S301) are provided. The first period (step S101~S104) is a storage period in which the storage mode is operated in the above-described storage mode. When the memory cell MC is selected by activating the word line WL and the bit line BL in the first period, the precharge circuit PRE including the pMOS transistor MP1 serving as the first current source is activated in S101. The precharge circuit PRE applies the read potential VRD to the selected memory cell MC via the first current path (bit line BL) to cause the read current Icel from the selected memory cell MC to flow in the first current path (step S102). Here, a leakage current generated from a large number of unselected memory cells MC also flows through the first current path.

When the pMOS transistor MP1 serving as the first current source is activated, the pMOS transistor MP2 serving as the second current source is also activated. As a result, the read current Icel flowing in the first current path (bit line BL) is transferred to the second current path (current detecting line CDL) (step S103). At the same time, the leakage current flowing through the first current path is also transferred to the second current path. The current comparator CCMP stores the detected current Ird2a proportional to the read current Icel as the storage current through the second current S104. Similarly, the current comparator CCMP stores the leakage current flowing through the second current path.

The second period (step S201~S205) is a comparative period that operates in the above-described comparison mode. In the second period, the selected word line WL is deactivated while maintaining the selected state of the bit line BL in the step S101, and all the memory cells MC are set to the non-selected state in response to the deactivation of the selected word line WL in the step S201. In step S202, the reference cell RC is selected by activating the reference word line RWL. As a result, the precharge circuit PRE causes the read reference current Iref from the reference cell RC to flow through the first current path (bit line BL) (step S203). Also in this case, a leakage current generated from a large number of unselected memory cells MC also flows through the first current path.

The read reference current Iref flowing in the first current path (bit line BL) is transferred to the second current path (current detection line CDL) (step S204). At the same time, the leakage current flowing through the first current path is also transferred to the second current path. The current comparator CCMP compares the magnitude of the detection current Irr2a, which is proportional to the read reference current Iref obtained through the second current path, with the magnitude of the detection current (storage current) Ird2a stored in the first period (storage period) (step S205). In the step S205, the leakage current storage in the first period is subtracted from the leakage current flowing through the second current path. Thereafter, in the third period (step S301), the current comparison result is amplified by the sense amplifier circuit [2] SA2ND. As described in FIG. 4, for example, the first period and the second period may be interchanged, the second period may be a storage period for storing the read reference current Iref, and the first period may be a comparison period for comparative the read current Icel and the read reference current Iref.

(Main Effects of Embodiment 1)

As described above, in the method of the first embodiment, reading in time division is performed while the bit line selection circuit YSW is activated. As a result, the effect of the bit-line leakage current can be eliminated by subtracting the leakage current in the step S205 of FIG. 5, and the read margins can be enlarged. In addition, by providing two current paths, providing the bias control circuit BSCT in one current path, and providing the current comparator circuit CCMP in the other current path, the read potential VRD applied to the memory cell MC, in particular, the flash memory cell, can be increased. As a result, the read margin can be enlarged. By enlarging the read margin, higher density, lower voltage, and the like of the memory, and thus the semiconductor device including the memory, can be realized.

Embodiment 2

(Configuration and Operation of a Semiconductor Device)

Figure 6:
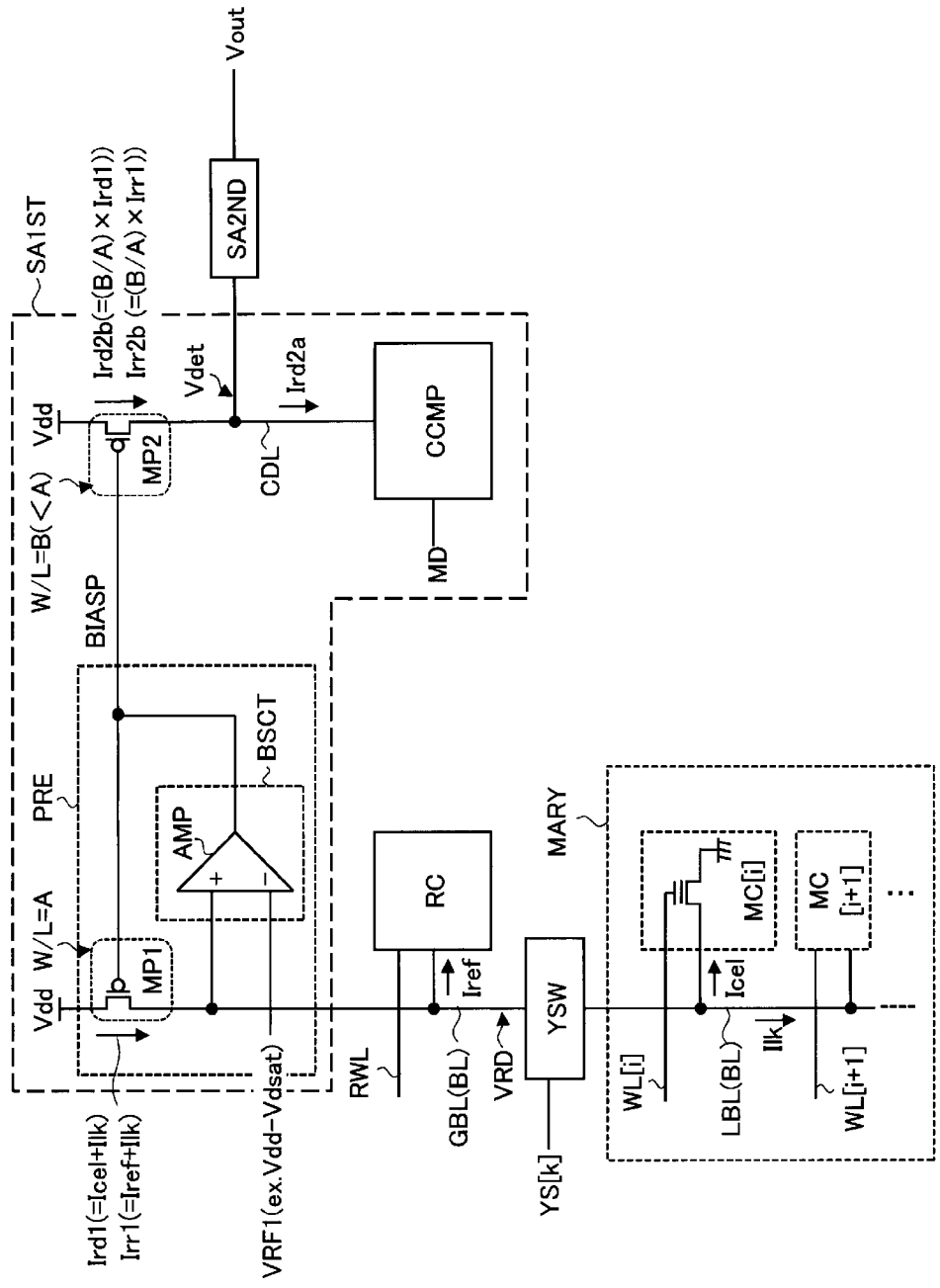
FIG. 6 is a circuit block diagram showing a configuration example of a main portion in the semiconductor device according to the second embodiment of the present invention.

FIG. 6 is a circuit block diagram showing a configuration example of a main part in the semiconductor device according to the second embodiment of the present invention. The semiconductor device of FIG. 6 differs from the semiconductor device of FIG. 1 in the current mirror ratio of the pMOS transistor MP1,MP2. Specifically, the ratio (gate width (W)/gate length (L)) B between the gate width and the gate length of the pMOS transistor MP2 is smaller than the ratio A between the gate width and the gate length of the pMOS transistor MP1.

Thus, the current flowing through the pMOS transistor MP2 is set to be smaller than the current flowing through the pMOS transistor MP1. Since the load driven by the pMOS transistor MP2 is sufficiently smaller than the load driven by the pMOS transistor MP1, there is no particular problem even if the current flowing through the pMOS transistor MP2 is reduced. When the current mirror ratio (B/A) is set, preferably, the gate length (L) of the pMOS transistor MP1 is set near the smallest dimension, and the gate length (L) of the pMOS transistor MP2 is set as large as possible.

Figure 7:
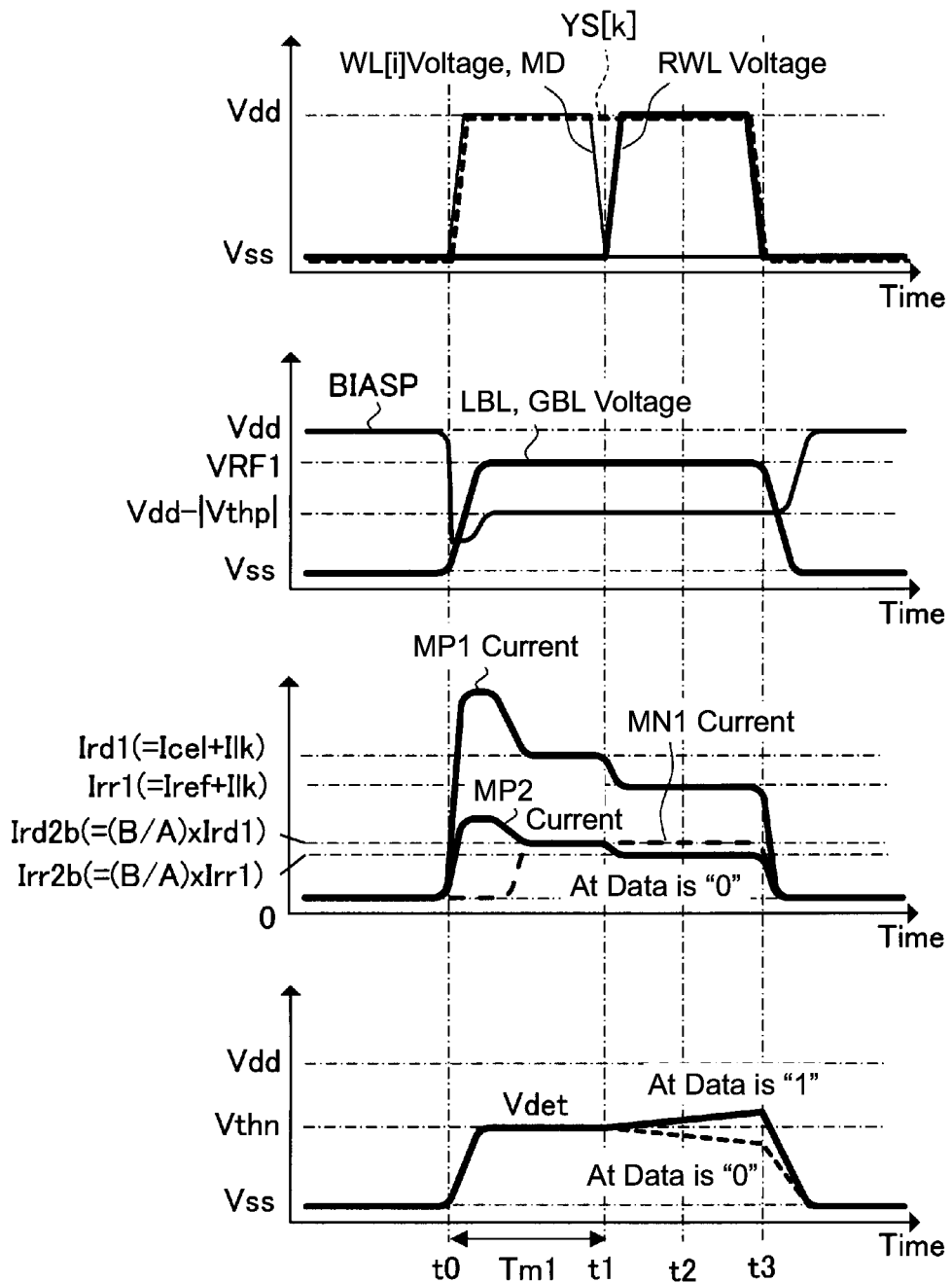
FIG. 7 is a waveform diagram showing an operation example at the time of the read operation in the semiconductor device of FIG. 6.

FIG. 7 is a waveform diagram showing an operation example at the time of a read operation in the semiconductor device of FIG. 6. In FIG. 7, the magnitude of the detection current Ird2b flowing through the pMOS transistor MP2 in the storage mode and the magnitude of the detection current Irr2b flowing through the pMOS transistor MP2 in the comparative mode are different from those in FIG. 4. The detected current Ird2b in the storage mode is "(B/A)×Ird1" by using the actual read current Ird1 flowing through the pMOS transistor MP1 and the current mirror ratio (B/A) in the storage mode. The detected current Irr2b in the comparative mode is "(B/A)×Irr1" by using the actual read-reference current Irr1 flowing through the pMOS transistor MP1 and the current mirror ratio (B/A) in the comparison mode.

(Main effects of the second embodiment) or more, by using the method of the second embodiment, in addition to the various effects described in the first embodiment, further, it is possible to suppress the increase in power consumption. More specifically, in the configuration of the comparative example shown in FIG. 13, while there is one current path associated with the pMOS transistor MP1', in the configuration example of FIG. 6, there are three current paths obtained by adding the current path of the bias-control circuit BSCT to the two current paths associated with the pMOS transistor MP1,MP2. Therefore, when the current mirror ratio (B/A) of the pMOS transistor MP1,MP2 is set to "1/1" as in the case of FIG. 1, there is a fear that the power consumed during the read operation may be increased.

As a specific example, assuming that the consumption current of the current paths associated with the pMOS transistor MP1' of FIG. 13 is Ix and the consumption current of the bias control circuit BSCTa of FIG. 2 is "0.25×Ix", the consumption current generated in the configuration example of FIG. 1 is "(1+1+0.25)×Ix". On the other hand, when the current mirror ratio (B/A) is set to "¼", for example, the consumption current generated in the configuration example of FIG. 6 is "(1+0.25+0.25)×Ix". As a result, an increase in power consumption can be suppressed as compared with the configuration example of FIG. 1.

Further, by setting the gate length (L) of the pMOS transistor MP1 to the vicinity of the smallest dimension, the gain of the pMOS transistor MP1 can be increased and the settling time of the current can be shortened. As a result, in FIG. 7, the storage period Tm1, which is a period from time t0 to t1, can be shortened, and thus the read accessing time can be shortened. On the other hand, by setting the gate length (L) of the pMOS transistor MP2 to be as large as possible, the output impedance can be increased. As a result, the voltage amplitude of the detected potential Vdet can be increased in the comparative period, which is the period from time t1 to t3 in FIG. 7.

Embodiment 3

(Variation of the Bias Control Circuit)

Figure 8:
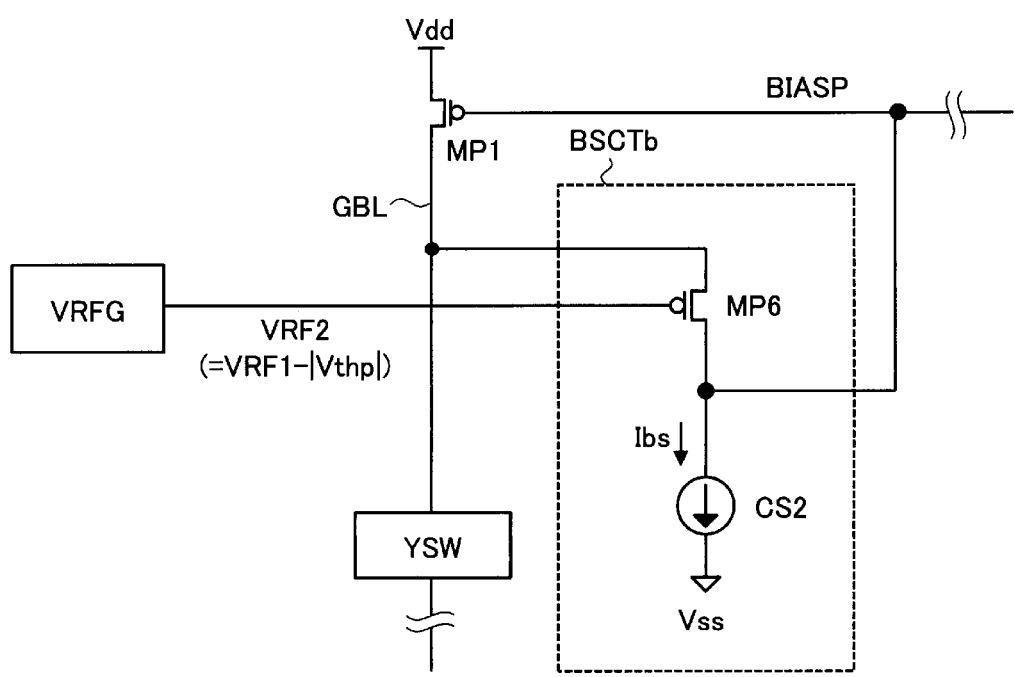
FIG. 8 is a circuit diagram showing a configuration example around the bias control circuit of FIG. 1 in the semiconductor device according to the third embodiment of the present invention.

FIG. 8 is a circuit diagram showing a configuration example around the bias control circuit of FIG. 1 in the semiconductor device according to the third embodiment of the present invention. The bias control circuit BSCTb shown in FIG. 8 includes a pMOS transistor MP6 and a constant current source CS2, and functions as a gate-grounded amplifier circuit. In the pMOS transistor MP6, the reference potential VRF2 from the reference potential generator VRFG is applied to the gate (control node), and a current path is provided between the bit line BL (global bit line GBL) and the control node of the pMOS transistor MP1.

Figure 9:
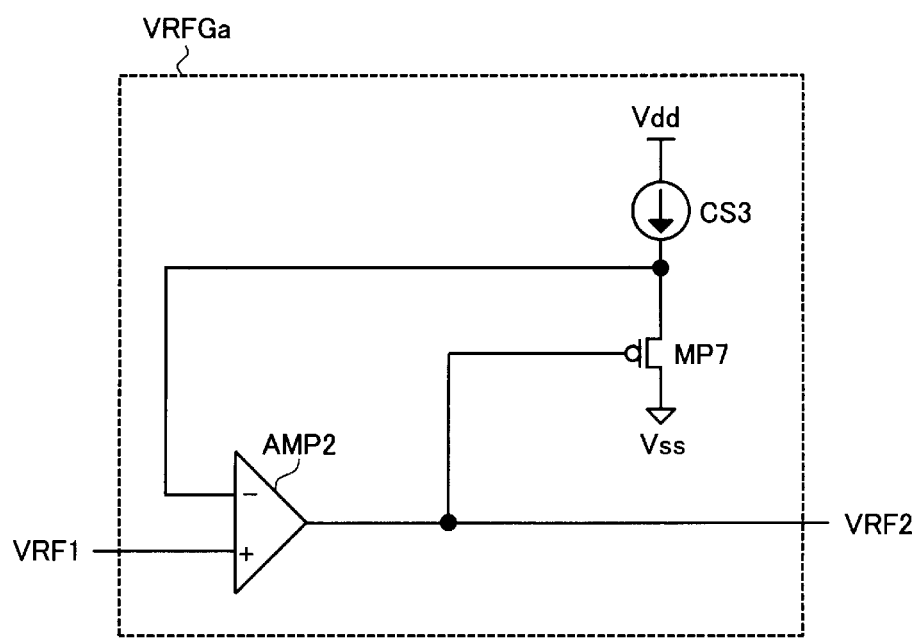
FIG. 9 is a circuit diagram showing a configuration example of a reference potential generating circuit in FIG. 8.

FIG. 9 is a circuit diagram showing a configuration example of the reference potential generation circuit in FIG. 8. The reference-potential generating circuit VRFGa shown in FIG. 9 includes a pMOS transistor MP7, a constant-current source CS3, and an amplifier circuit AMP2. The pMOS transistor MP7 and the constant current source CS3 function as replica circuits of the pMOS transistor MP6 and the constant current source CS2 of FIG. 8. The amplifier circuit AMP2 controls feedback of the gate potential of the pMOS transistor MP7 so that the source potential of the pMOS transistor MP7 becomes the reference potential VRF1 (e.g., Vdd-Vdsat) shown in FIG. 1. The amplifier AMP2 outputs the gate potential as the reference potential VRF2.

As a result, the amplifier AMP2 outputs "VRF1-|Vthp|" (Vthp is the threshold voltage of the pMOS transistor MP7 (and thus MP6) as the reference potential VRF2. That is, the reference potential generating circuit VRFGa of FIG. 9 can output a potential lower than the reference potential VRF1 only by the threshold voltage Vthp of the pMOS transistor MP7 (and thus MP6) as the reference potential VRF2 even when various environmental changes such as temperature changes occur.

Such a reference potential VRF2(=VRF1-|Vthp|) is applied to the gate of the pMOS transistor MP6 in FIG. 8. As a result, when the potential of the global bit line GBL is lower than the reference potential VRF1, the pMOS transistor MP6 is turned off, and the directions potential BIASP is changed to a lower bias potential. As a result, the pMOS transistor MP1 is turned on, and the potential of the global bit line GBL is changed to rise. On the other hand, when the potential of the global bit line GBL rises and becomes higher than the reference potential VRF1, the pMOS transistor MP6 is turned on and the bias potential BIASP is changed to rise. As a result, the pMOS transistor MP1 changes in the off-direction, and the potential of the global bit line GBL changes in the down-direction. By such negative feedback control, the potential of the global bit line GBL is set to the reference potential VRF1 in the same manner as in the first embodiment.

In addition, the read operation of the memories is substantially the same as that of FIG. 4 or FIG. 7, but in detail, the magnitude of the respective currents flowing through the pMOS transistor MP1,MP2 and the nMOS transistor MN1 differs slightly from that of FIG. 4 or FIG. 7. This is because, in the bias control circuit BSCTb of FIG. 8, unlike the bias control circuit BSCTa of FIG. 2, the bias current Ibs associated with the constant current source CS2 of FIG. 8 flows through the global bit line GBL.

Thus, for example, taking FIG. 7 as an example, the actual read current Ird1 becomes "Icel+Ilk+Ibs", and the actual read reference current Irr1 becomes "Iref+Ilk+Ibs". The detection current Ird2b is (B/A) times the actual read current Ird1, and the detected current Irr2b is (B/A) times the actual read reference current Irr1. However, since the bias current Ibs is offset by the current comparator CCMP as in the case of the leakage current Ilk, the bias current Ibs does not affect the read margins.

(Main Effects of Embodiment 3)

As described above, by using the method of Embodiment 3, in addition to the various effects described in Embodiments 1 and 2, as can be seen from comparing the bias control circuit BSCTa of FIG. 2 and the bias control circuit BSCTb of FIG. 8, an increase in area overhead can be suppressed. Since one reference-potential generating circuit VRFGa in FIG. 9 may be commonly provided for the entire semiconductor device, the area overhead of the reference-potential generating circuit is not particularly problematic. In addition, since the number of current paths in the bias control circuit can be reduced from two to one, the power consumption can be further reduced. For example, the current value of the constant current source CS2 of FIG. 8 may be ½ or the like of the current value of the constant current source CS1 of FIG. 2.

Embodiment 4

(Variation of the Bias Control Circuit)

Figure 10:
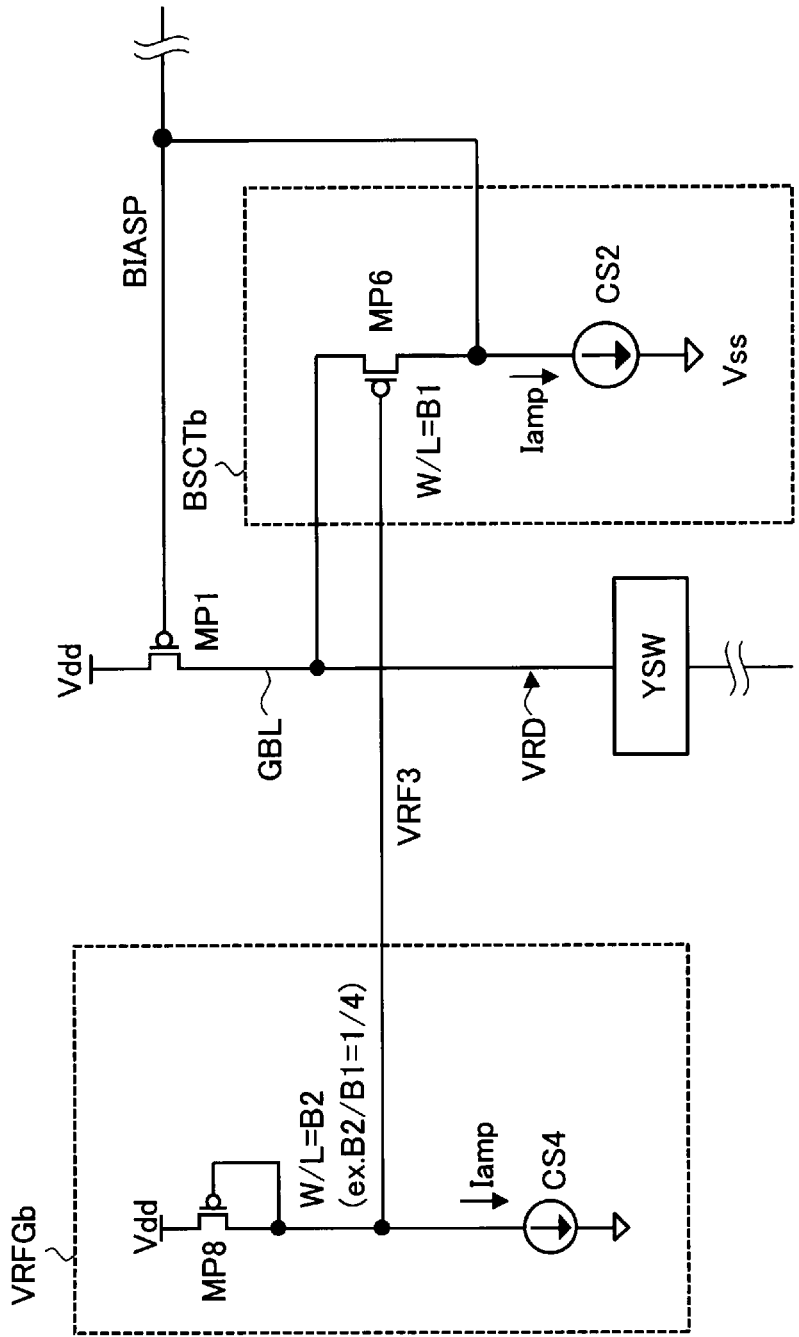
FIG. 10 is a circuit diagram showing a configuration example around the bias control circuit of FIG. 1 in the semiconductor device according to the fourth embodiment of the present invention.

FIG. 10 is a circuit diagram showing a configuration example around the bias control circuit of FIG. 1 in the semiconductor device according to the fourth embodiment of the present invention. FIG. 10 shows a bias control circuit BSCTb same to the bias control circuit of FIG. 8. However, in FIG. 10, the gate potential of the pMOS transistor MP6 in the bias control circuit BSCTb is generated by a reference potential generation circuit VRFGb which differs from the reference potential generation circuit in FIG. 9.

The reference-potential generator VRFGb of FIG. 10 includes a pMOS transistor MP8 and a constant-current source CS4. The pMOS transistor MP8 is provided between the power supply potential Vdd and the gate of the pMOS transistor MP6, and is diode-connected. The constant current source CS4 is provided between the pMOS transistor MP8 and the grounding power supply potential Vss, and determines a current flowing through the pMOS transistor MP8.

Here, when both the current value of the constant current source CS2 and the current value of the constant current source CS4 are "Iamp", the ratio (W/L) B2 between the gate width and the gate length of the pMOS transistor MP8 is determined to be, for example, B2/B1=1/4 or less with respect to the ratio (W/L) B1 between the gate width and the gate length of the pMOS transistor MP6. As a result, the reference potential generator VRFGb of FIG. 10 generates a reference potential VRF3 such as "Vdd−(|Vthp|+2×Vdsat)" (Vdsat is the saturated drain voltage of the pMOS transistor MP1,MP6), for example. With such a reference potential VRF3, the read potential VRD is set to "Vdd-Vdsat", and then the pMOS transistor MP6 can be operated in the saturating range.

The circuit portion composed of the pMOS transistor MP1,MP6, the constant current source CS2, and the reference-potential generating circuit VRFGb has the same configuration as the circuit configuration of the transfer source in the low-voltage cascode current mirror circuit. Therefore, similarly to the low-voltage cascode current mirror circuit, the pMOS transistor MP1 can stably operate as a constant current source while the drain-source voltage Vds is set to the saturated drain voltage Vdsat (the read potential VRD is "Vdd-Vdsat").

(Main effects of the fourth embodiment) From the above, by using the method of the fourth embodiment, in addition to the various effects described in the third embodiment, it is possible to further suppress the increase in area overhead as determined from the comparative between the reference potential generating circuit VRFGa of FIG. 9 and the reference potential generating circuit VRFGb of FIG. 10. That is, in the case of FIG. 9, a circuit for generating the reference potential VRF1 is also separately required in addition to the amplifier circuit AMP2, but in the case of FIG. 10, both of them are not required.

Embodiment 5

(Modification of the Current Comparing Circuit)

Figure 11:
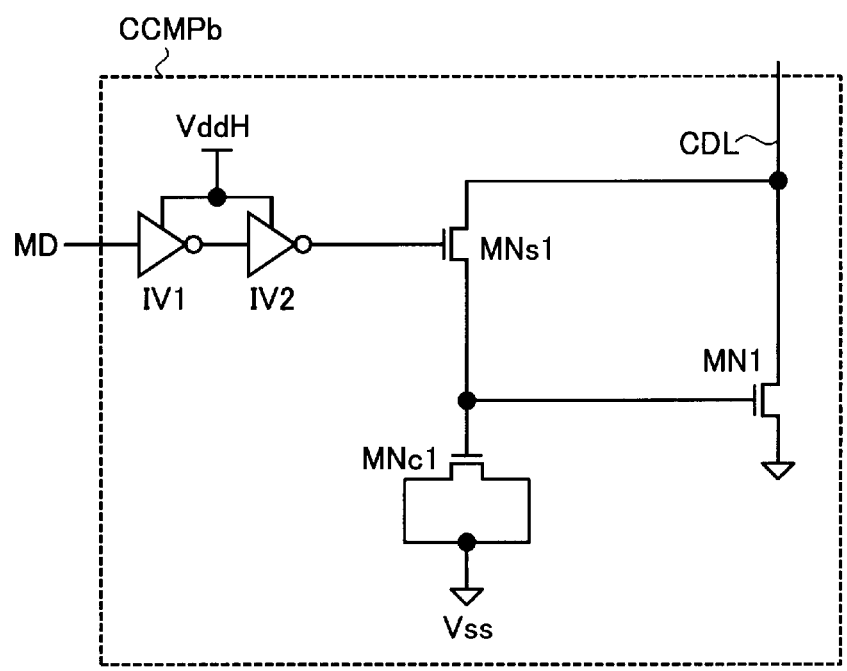
FIG. 11 is a circuit diagram showing a configuration example of a current comparison circuit of FIG. 1 in the semiconductor device according to an embodiment 5 of the present invention.

FIG. 11 is a circuit diagram showing a configuration example of the current comparison circuit of FIG. 1 in the semiconductor device according to the fifth embodiment of the present invention. The current comparison circuit CCMPb shown in FIG. 11 differs from the current comparison circuit CCMPa of FIG. 3B in the following points. As a first difference, the pMOS transistor MPs1 constituting the changeover switch SW1 of FIG. 3A is eliminated. As a second difference, the inverter circuit IV1,IV2 operates at a power supply potential VddH high than the potential Vdd. As a result, the nMOS transistor MNs1 constituting the changeover switch SW1 is controlled by a mode changeover signal (switch control signal) MD having a voltage amplitude larger than the voltage amplitude between the power supply potential Vdd and the grounding power supply potential Vss.

For example, in the current comparator CCMPa of FIG. 3B, when the nMOS transistor MNs1 and the pMOS transistor MPs1 are controlled to be turned on, a voltage having a magnitude of, for example, about half the power supply potential Vdd is applied between the gate and the source of each transistor (MNs1,MPs1) in actual operation. As a result, the on-resistance of both the transistors MNs1,MPs1 can be increased.

Therefore, in FIG. 11, by supplying the high power supply potential VddH to the inverter circuit IV1,IV2, the gate-source voltage of the nMOS transistor MNs1 can be increased, and the on-resistance of the nMOS transistor MNs1 can be reduced. Similarly, in order to reduce the on-resistance of the pMOS transistor MPs1 in FIG. 3B, a potential (negative potential) lower than the grounding power supply potential Vss may be supplied to the inverter circuit IV1,IV2. In the embodiment of FIG. 11, since the resistors of the changeover switches can be sufficiently lowered only by the nMOS transistors MNs1, the pMOS transistors MPs1 are eliminated from the viewpoint of unnecessary negative potential generation circuits and from the viewpoint of reducing area overhead.

However, in FIG. 11, the pMOS transistor MPs1 of FIG. 3B may be intentionally left even when the negative potential generating circuits are not provided. By leaving the pMOS transistor MPs1, coupling noise at the time of switch-off can be canceled with the nMOS transistor MNs1, which is advantageous in terms of stabilization and noise convergence times. Note that a flash memory is usually provided with a circuit for generating a power supply potential high than the power supply potential Vdd, such as various power supply circuits for writing. Since the power supply potential VddH may be a potential generated by such circuits, area overhead is not particularly problematic.

Figure 12:
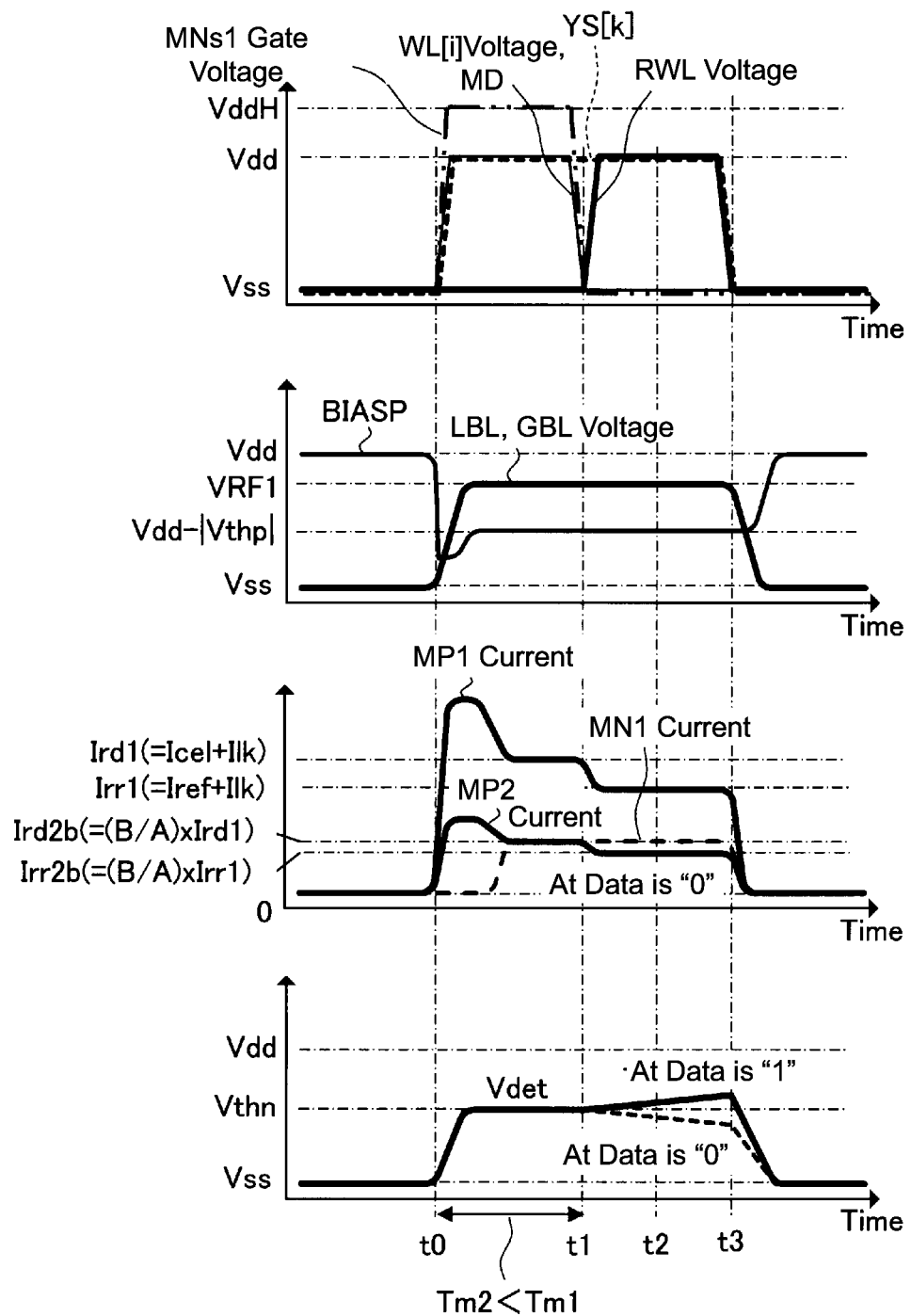
FIG. 12 is a waveform diagram showing an operation example at the time of the read operation of the semiconductor device equipped with the current comparison circuit of FIG. 11.

FIG. 12 is a waveform diagram showing an operation example of the semiconductor device in which the current comparison circuit of FIG. 11 is mounted at the time of a read operation. In FIG. 12, the waveform of the gate potential of the nMOS transistor MNs1 is added to the waveform diagram of FIG. 7. A power supply potential VddH high than the power supply potential Vdd is applied to the gates of the nMOS transistors MNs1 during the storage periods Tm2 from time t0 to t1. As a result, since the on-resistance of the changeover switch SW1 decreases, it is possible to shorten the time required for the current of the pMOS transistor MP2 and the current of the nMOS transistor MN1 to coincide with each other in the storage period Tm2. As a result, the storage period Tm2 of FIG. 12 can be set shorter than the storage period Tm1 of FIG. 7, and thus the read accessing time can be shortened.

(Major Effects of Embodiment 5)

As described above, by using the method of Embodiment 5, in addition to the various effects described in Embodiments 1 to 4, it is possible to suppress an increase in access time which is a concern in the case of using the time-division reading method. Note that the use of the power supply potential VddH raises concerns about an increase in power consumption; however, since the portion to which the power supply potential VddH is applied is the gate of the nMOS transistor MNs1, no steady-state current is generated, and the influence on the increase in power consumption is small.

Although the invention made by the present inventor has been specifically described based on the embodiment, the present invention is not limited to the embodiment described above, and various modifications can be made without departing from the gist thereof. For example, the above-described embodiments have been described in detail in order to easily understand the present invention, and are not necessarily limited to those having all the configurations described. In addition, a part of the configuration of one embodiment can be replaced with the configuration of another embodiment, and the configuration of another embodiment can be added to the configuration of one embodiment. It is also possible to add, delete, or replace some of the configurations of the respective embodiments.

What is claimed is:

1. A semiconductor device comprising:
   a plurality of word lines;
   a bit line;
   a plurality of memory cells arranged at intersections of the word lines and the bit line, and selected by the word lines;
   a reference word line activated in time division manner for the word lines;
   a reference cell arranged at an intersection of the reference word line and the bit line, and selected by the reference word line;
   a precharge circuit configured to apply a reading voltage to the bit line, and configured to send a reading current from a selected memory cell selected by one of the word lines and a reading reference current from the reference cell in the time division manner;
   a current detection line through which a detection current which is proportional to a current flowing the bit line flows; and
   a current comparing circuit connected to the current detection line, and configured to compare the detection current and the reading reference current,
   wherein the precharge circuit comprises:
      a first transistor whose current path is arranged between a first power supply and the bit line; and
      a bias control circuit configured to feedback control a control voltage of the first transistor by inputting a voltage of the bit line and a predetermined reference voltage.

2. The semiconductor device according to claim 1, further comprising a second transistor whose current path is arranged between the first power supply and the current detection line, and configured to receive the control voltage of the first transistor.

3. The semiconductor device according to claim 2, wherein a ratio of a gate width and a gate length of the second transistor is smaller than that of the first transistor.

4. The semiconductor device according to claim 2,
   wherein the current comparing circuit comprises:
      a third transistor whose current path is arranged between the current detection line and a second power supply;
      a switch configured to change a connection of the third transistor to a diode connection when activated; and
      a capacitor element configured to retain a control voltage of the third transistor.

5. The semiconductor device according to claim 4,
   wherein the switch is a MOS transistor, and
   wherein an activation of the switch is controlled by a switch control signal having a voltage amplitude larger than a voltage difference between the first power supply and the second power supply.

6. The semiconductor device according to claim 1, wherein the bias control circuit comprises a differential amplifier circuit configured to feedback control the control voltage of the first transistor so that the voltage of the bit line matches to the reference voltage.

7. The semiconductor device according to claim 1, wherein the bias control circuit comprises:
- a third transistor whose current path is arranged between the bit line and a control terminal of the first transistor, and having a control terminal applied the reference voltage; and
- a first constant current source arranged between the third transistor and a second power supply, and configured to flow a load current to the third transistor.

8. The semiconductor device according to claim 7, further comprising a reference voltage generating circuit configured to generate the reference voltage,
wherein the reference voltage generating circuit comprises:
- a fourth transistor arranged between the first power supply and the control terminal of the third transistor, and composed of diode connection, and
- a second constant current source arranged between the fourth transistor and the second power supply, and configured to flow a constant current to the fourth transistor.

9. The semiconductor device according to claim 1, wherein the first transistor is a p-channel MOS transistor, and
wherein the precharge circuit changes the reading voltage to a voltage lower than a voltage of the first power supply by a saturation drain voltage of the first transistor.

10. The semiconductor device according to claim 1, wherein the bit line comprises:
- a plurality of local bit lines; and
- a global bit line provided in common to the plurality of the local bit lines and connected to one of the plurality of local bit lines via a bit line selection switch, wherein the plurality of the local bit lines are connected to the plurality of the memory cells respectively,
wherein the global bit line is connected to the reference cell, and
wherein the global bit receives the reading current from the selected memory cell and a reading reference current from the reference cell in the time division manner when a selected one of the plurality of the local bit line is connected to the global bit line.

11. The semiconductor device according to claim 1, wherein the memory cells are flash memory cells.

12. A method for reading data of a memory, the method comprising:
- (a) flowing a reading current from a selected memory cell to a first current path by applying a reading voltage to the selected memory cell via the first current path;
- (b) flowing a reading reference current from a reference cell to the first current path;
- (c) store one of a first detection current which is proportional to the reading current or a second detection current which is proportional to the reading reference current via a second current path as a memory current; and
- (d) comparing another one of a first detection current which is proportional to the reading current or a second detection current which is proportional to the reading reference current with the memory current.

13. The method according to claim 12,
wherein (a) and (b) are performed by a precharge circuit having a current source composed of a MOS transistor, and
wherein the reading voltage is lower than a power supply voltage by a saturation drain voltage of the MOS transistor.

14. The method according to claim 12, wherein a current flowing through the second current path is smaller than that of the first current path.

15. The method according to claim 12,
wherein the first current path having:
- a local bit line connected to a plurality of memory cells; and
- a global bit line connected to the reference cell and a precharge circuit, and wherein, at performing (a) and (b), the local bit line and the global bit line is connected via a bit line selecting circuit.

16. The method according to claim 12, wherein the memory is a flash memory.

* * * * *